United States Patent [19]

Konrad et al.

[11] 4,002,972
[45] Jan. 11, 1977

[54] ELECTRIC VEHICLE CONTROL ANALYZER

[75] Inventors: Charles Edward Konrad; Lynnie Barry Brown, both of Roanoke, Va.

[73] Assignee: General Electric Company, New York, N.Y.

[22] Filed: Mar. 18, 1975

[21] Appl. No.: 559,496

[52] U.S. Cl. ............................ 324/73 R; 324/28 R; 324/51

[51] Int. Cl.² ................ G01R 15/12; G01R 31/02

[58] Field of Search ...... 324/73 R, 158, 51, 28 CB, 324/28 R

[56] References Cited

UNITED STATES PATENTS

| 3,423,677 | 1/1969 | Alford et al. | 324/73 |
|---|---|---|---|
| 3,424,979 | 1/1969 | Stocker | 324/73 |
| 3,478,264 | 11/1969 | Tsergas | 324/73 |
| 3,553,581 | 1/1971 | Tsergas et al. | 324/158 |
| 3,646,438 | 2/1972 | Staff | 324/73 R |

*Primary Examiner*—R. V. Rolinec
*Assistant Examiner*—Vincent J. Sunderdick
*Attorney, Agent, or Firm*—Walter C. Bernkopf; James H. Beusse

[57] ABSTRACT

An analyzer for an electrical vehicle control system which includes a self-contained power source to allow excitation and evaluation of individual components in the control system. The analyzer plugs into the control system and includes a plurality of switches for selectively connecting various output terminals of the analyzer to internal logic circuits for monitoring the operation of selected components of the control system on an individual basis.

11 Claims, 3 Drawing Figures

ELECTRIC VEHICLE CONTROL ANALYZER

BACKGROUND OF THE INVENTION

This invention relates to electric vehicle control systems and, more particularly, to apparatus for fault analyzing an electric vehicle control system.

Recent advances in solid-state motor control systems have made electric vehicles increasingly popular. Although solid-state control systems are more reliable than the older electromechanical control systems, fault location in a solid-state system is more difficult because the systems are more sophisticated and the components are more complicated than electromechanical systems. To cope with this trouble-shooting problem, various types of test instruments have been developed. In general, these test instruments are more complicated and sophisticated than the system they are designed to test and thus tend to make the trouble-shooting task more difficult than is desired. One particular problem that has been experienced with prior art analyzers is their inability to function on a wide range of control system voltages without setting an input selector switch to a proper voltage range.

A further difficulty in prior art analyzers is their inability to test individual components in the control system. This latter difficulty is often caused by the fact that the logic circuitry which operates the control system is general inaccessible to an analyzer.

It is a further object of the present invention to provide an improved analyzer for an electric motor control which will operate on a wide range of control voltages without adjustment.

It is a still further object of the present invention to provide an improved analyzer for an electric vehicle control system which will test individual components in the system.

Briefly, in accordance with one embodiment of the present invention there is provided an analyzer for an electric vehicle control system including a connector which allows the analyzer to be connected into the control system. The logic circuit card for the control is removed and the analyzer connected in its place. The analyzer includes a plurality of switches which allows each component of the control system to be individually evaluated.

BRIEF DESCRIPTION OF THE DRAWINGS

For a better understanding of the present invention, reference may be had to the accompanying drawings in which.

DETAILED DESCRIPTION

Figure 1:
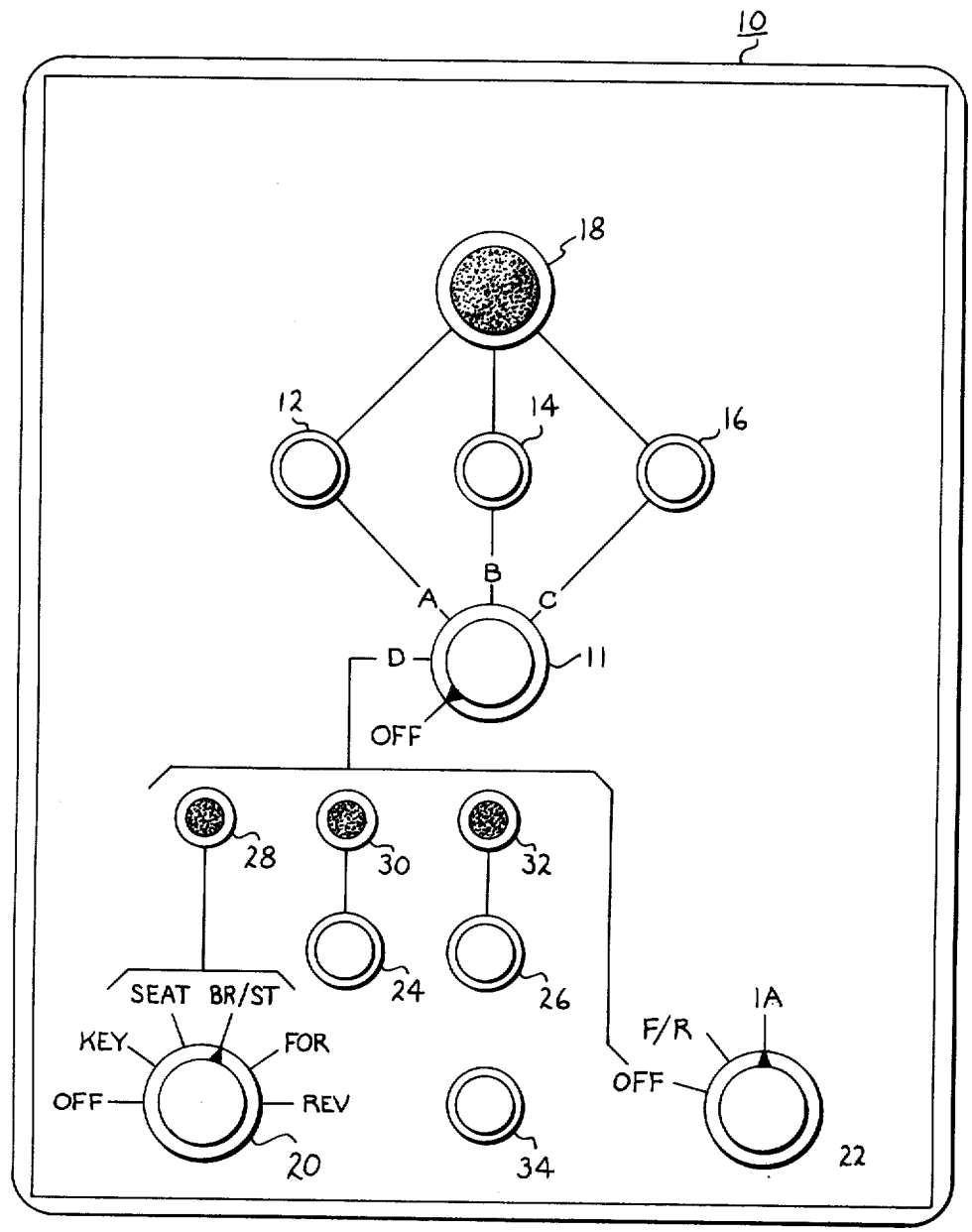
FIG. 1 is a plan view of one package configuration of the invention showing the arrangement of switches and indicators.

Referring not to FIG. 1 there is shown one configuration of the analyzer 10 of the present invention which allows simplified operating procedures. A five-position rotary switch 11 operates as a first selector switch to select one of three component tests by selecting either A, B, or C. Pushbutton switches 12, 14, and 16 are connected respectively in each circuit corresponding to positions A, B and C of switch 11. Actuation of the proper pushbutton 12, 14 or 16 will cause indicator light 18 to illuminate when the associated component being tested is operable.

In position D switch 11 provides connection for rotary switches 20 and 22 and pushbutton switches 24 and 26. With switch 11 in position D, switches 20 and 22 may be rotated to select a particular component to be tested and proper operation of a component selected by switch 20 will be indicated by excitation of indicator 28. Similarly, switches 24 and 26 may be utilized to test other components in the control system and proper operation of those components will be indicated by excitation of indicators 30 and 32 respectively. A pushbutton switch 34 is utilized during self-test of the analyzer and provides an indication when all elements of the analyzer are properly functioning by simultaneously exciting indicators 18, 28, 30 and 32.

Figure 2:
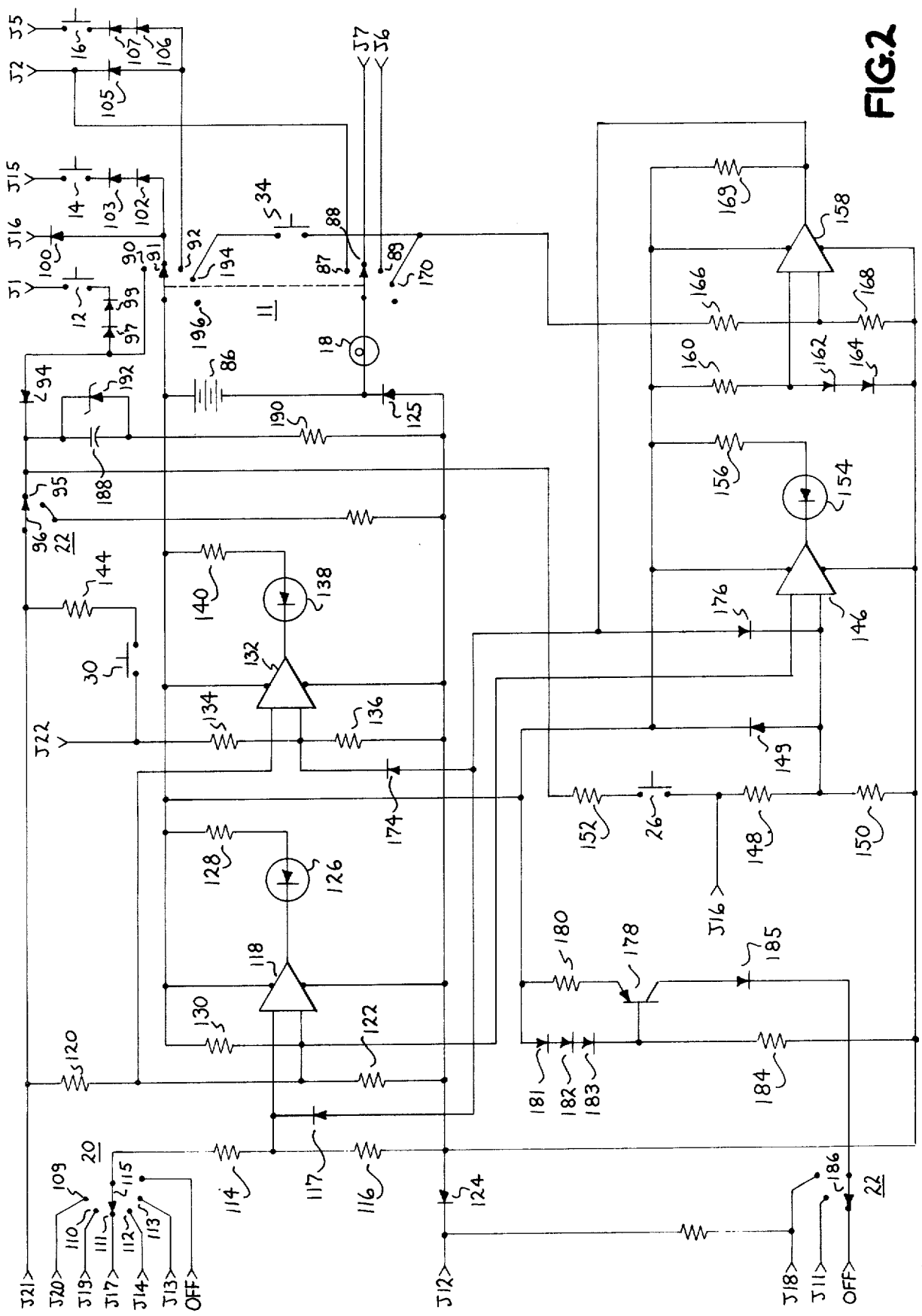
FIG. 2 is a schematic diagram of the apparatus of the present invention.

Referring now to FIG. 2 there is shown a schematic diagram of the apparatus of the present invention. For a better understanding of the present invention, reference should be made to FIG. 3 in which is shown a schematic diagram of a solid-state motor control system for an electric vehicle. The control includes a traction battery 44 which, depending upon the particular application, may produce a terminal voltage between 12 and 84 volts. Battery 44 is connected by means of a silicon controlled rectifier (SCR) 46 to supply power to a traction motor comprising a field winding 48 and an armature 50. Contacts F1, F2 and R1, R2 associated with contactor coils 52 and 53 respectively are arranged to connect coil 48 in circuit with armature 50 in a manner to produce either forward or reverse rotation of the drive motor.

Logic signals to control contactor coils 52 and 53 are supplied from logic board 62 by means of current driver 55. Diodes 85 and 87 are connected as flyback and plugging diodes respectively.

Connected in circuit with SCR 46 is a commutating circuit comprising a commutating capacitor 54, SCR's 56 and 58, and transformer windings 60a, 60b, and 60c. Each of the SCR's 46, 56, and 58 are connected to receive gating signals from a logic circuit incorporated in circuit board 62. The gating signals to SCR's 46, 56 and 58 control the frequency and duration of current pulses applied to the traction motor.

The logic circuit on circuit board 62 is also connected to receive input signals from temperature sensor 64 and from current sensor 66. Other inputs signals to the logic circuit are supplied by an acceleration potentiometer 68 and by a plurality of switches 70, 72, 74, 76, 78 and 80 indicating respectively whether the ignition switch is on, whether the seat is occupied, whether the brake is on, whether the accelerator pedal is depressed and whether a forward or reverse direction is selected. A switch 82 is connected to accelerator pot 68 to provide a signal to logic board 62 when pot 68 is in the full acceleration position. The signal from switch 82 is used to activate contactor coil 84 by means of current driver 81, which coil 84 controls contacts 84A bypassing SCR 46.

Figure 3:
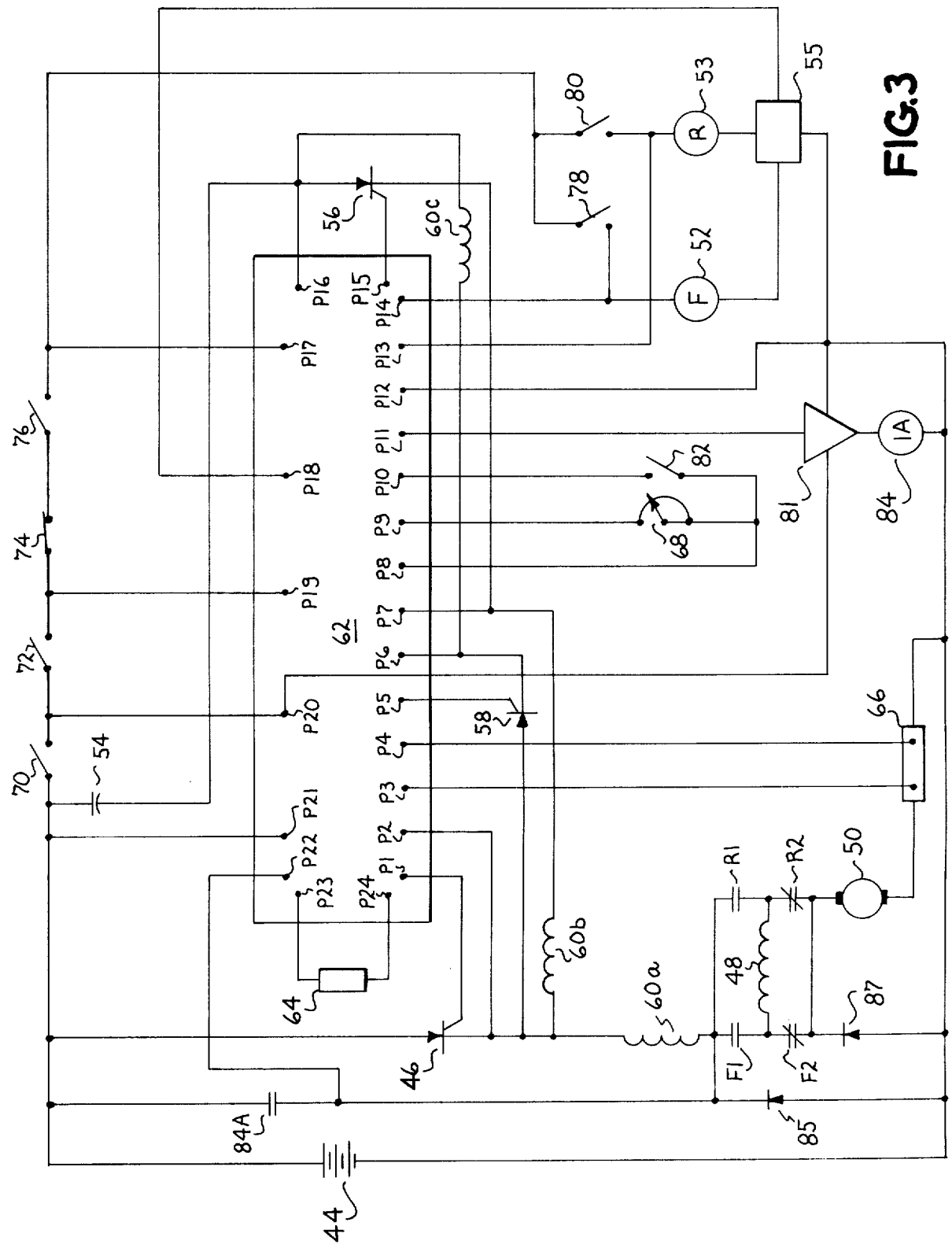
FIG. 3 is a schematic diagram of an electic vehicle control system.

Referring to FIG. 2, the analyzer of the present invention is designed to test the components of a motor control circuit such as that shown in FIG. 3 by connecting the analyzer into the motor control circuit in place of logic board 62. Since each component of the motor control circuit is in some manner connected to logic board 62, each component is accessible to the analyzer.

Switch 11 comprises a two wafer, five position rotary switch having the wiper of a first wafer connected to the positive terminal of a battery 86 and the wiper of a second wafer connected through indicator lamp 18 to the negative terminal of battery 86. Terminals 87, 88 and 89 of the first wafer are connected respectively to output terminals J2, J7, and J6. By comparison to FIG. 3, it can be seen that these terminals correspond to terminals P2, P7, and P6, of logic board 62 which are connected respectively to the cathodes of SCR's 46, 56 and 58. Contacts 90, 91, and 92 of the second wafer of switch 11 are each connected respectively to at least two output terminals. Contact 90 is connected to output terminal J21 by means of a diode 94 and a contact 95 and wiper 96 of switch 22. Contact 90 is further connected to output terminal J1 by means of diodes 97 and 99 and switch 12. Contact 91 is connected to output terminal J16 via diode 100 and to output terminal J15 via series diodes 102 and 103 and switch 14. Contact 92 is connected via diode 105 to output terminal J2 and by means of diodes 106 and 107 and switch 16 to output terminal J5. By comparison of FIG. 2 to FIg. 3 it can be seen that the analyzer output terminals associated with the first three positions of switch 11 correspond to the terminals of logic board 62 which are associated with SCR's 46, 56 and 58. Thus in the first three positions of switch 11, SCR3 s 46, 56 and 58 may be tested by the analyzer by application of an anode to cathode voltage and a gating voltage.

Still referring to FIG. 2, there is provided a second five position rotary wafer switch 20 including contacts 109, 110, 111, 112 and 113 and a wiper 115. Each of the contacts 109, 110, 111, 112, and 113 is connected respectively to corresponding output terminals J20, J19, J17, J14 and J13. Wiper 115 is connected by means of a voltage divider network comprising resistors 114 and 116, to an inverting input terminal of a comparator 118. A non-inverting input terminal of comparator 118 is connected to be biased by a voltage developed by a voltage divider comprising resistors 120 and 122. As can be seen, one terminal of resistor 120 is connected to output terminal J21 and one terminal of resistor 122 is connected to an output terminal J12 through diode 124 to form the voltage divider network. By reference to FIG. 3 it can be seen that with the analyzer connected into the motor control circuit, terminal J21 will be connected to the positive terminal of battery 44 and terminal J12 will be connected to the negative terminal battery 44. Thus the voltage applied to both input terminals of comparator 118 will be proportional to the terminal voltage of battery 44. Diode 124 connected in series with terminal J24 is provided to prevent damage to the analyzer in the event battery 44 is connected with reverse polarity. A blocking diode 125 prevents connecting of indicator 18 across the traction battery 44 when selector switch is in position A if the bypass relay is in a closed position. Since both input voltages to comparator 118 are derived from battery voltages, operation of comparator 118 is independent of the terminal voltage of battery 44.

The output of comparator 118 is connected to drive an indicator comprising a light emitting diode (LED) 126 connected through resistor 128 to battery 86. Comparator 118 is biased in a normally off mode by means of current supplied to the non-inverting input terminal from battery 86 through resistor 130. If the voltages monitored by switch 20 are of the correct value, comparator 118 will provide an output signal to LED 126 to cause LED 126 to illuminate.

A second comparator 132 has a first input terminal connected to a junction intermediate resistors 120 and 122 for providing a reference voltage proportional to traction battery voltage. A second input terminal of comparator 132 is connected by means of a voltage divider network comprising resistors 134 and 136 to output terminal J22. An output terminal of comparator 132 is connected to control an LED 138, which LED is biased by means of a resistor 140 connected between LED 132 and the positive terminal of battery 86. Comparator 132 is held in a normally off mode by means of bias current from battery 86 through resistor 130. By reference to FIG. 3, it can be seen that output terminal J22 corresponding to input terminal P22 of the motor control circuit is located such that the condition of diode 85 may be checked. Checking is performed by closing pushbutton switch 30 in FIG. 1 which applies traction battery voltage through a resistor 144 and switch 30 to output terminal J22. If diode 85 is not shorted, this voltage will be applied by means of resistor 134 to the second input terminal of comparator 132 and will cause LED 138 to be illuminated. Of course, if diode 85 is shorted, no voltage will appear at the second input terminal of comparator 132 and LED 138 will remain in the unilluminated state.

A third comparator 146 also has a first input terminal connected to the junction intermediate resistors 120 and 122 for developing a bias voltage proportional to traction battery voltage. A second input terminal of comparator 146 is connected to receive a voltage from a junction mediate a voltage divider network comprising resistors 148 and 150 serially connected between battery negative and a first terminal of pushbutton switch 26. A clamping diode 149 connected between the second input terminal and the positive terminal of battery 86 prevents the input voltage from exceeding the supply voltage. A second terminal of pushbutton switch 26 is connected through a resistor 152 to traction battery positive. The first terminal of switch 26 is connected to output terminal 16 which, by reference to FIG. 3, will result in resistor 152 and switch 26 being connected in parallel with commutating capacitor 54. For ease of understanding, two separate terminals J16 have been shown although it is to be understood that only a single common J16 exists. The output of comparator 146 is connected to an LED 154 which LED is biased by means of a resistor 156 connected to supply biasing current from the positive terminal of battery 86. As can be seen, when pushbutton switch 26 is closed, resistor 152 is connected in parallel with capacitor 54 and thereby discharging any accumulated charge on capacitor simultaneously applying a voltage to the second input terminal of comparator 146 thereby illuminating LED 154. When the pushbutton is released, capacitor 54 begins to charge through resistors 148 and 150. These latter resistors are selected such that the time constant of the capacitor voltage across resistor 150 will maintain LED 154 illuminated until capacitor 54 charges to the first time constant voltage. This time constant, via proper selection of resistor 150, can be selected to be in any desirable time such as, for example, one second, and will be independent of traction battery 44 voltage. In this manner the capacitor can be checked by timing the length of time required for LED 154 to be extinguished.

A fourth comparator 158 provides a self-test function of all other active elements in the described analyzer. A first input terminal of comparator 158 is connected by means of a resistor 160 to the positive terminal of battery 86. The first input terminal is also connected to be biased at two diode drops by means of series connected diodes 162 and 164 which are connected to battery negative. A second input terminal of comparator 158 is connected to a voltage divider comprising resistors 166 and 168 which voltage divider is connected between the negative terminal of battery 86 and terminal 170 of switch 11. A pull-up resistor 169 connects the output of comparator 158 to the positive terminal of battery 86.

The output of comparator 158 is connected by means of diodes 117, 174, and 176 to each of the signal input terminals of comparators 118, 132 and 146 respectively to thereby provide a biasing voltage to each of the comparators for forcing their respective outputs high and allowing the LED's connected to each output to be illuminated.

A third two wafer rotary switch 12 is provided for supplying a voltage for testing each of the contactor coils 52, 53 and 84, and coil drivers 55 and 81 in the motor control circuit. Since each of the contactor coils are controlled by solid state driver circuits, it is only necessary to supply sufficient current to energize the driving circuit in order to test the coil themselves. This current is supplied by a current source comprising a transistor 178 having its collector connected through resistor 180 to the positive terminal of battery 86 and its base biased by means of diodes 181, 182 and 183 and resistor 184.

The emitter of transistor 178 is connected through a diode 185 to a wiper 186 on a first wafer of switch 22. A second wafer of switch 22 provides a safety function in that it is necessary when testing the actuation of the contactor coils that the motor not be energized. This is provided by the fact that when switch 22 is in other than the first position, the traction battery 44 positive terminal is disconnected from switch 11 and no voltage can be applied to the control rectifiers which supply power to the traction motor.

In the operation of the analyzer of the present invention, it has been found that some silicon controlled rectifiers will not turn-on properly when both the gate and anode are at the same voltage potential. Plus, in the present invention it has been found necessary to add two diodes in series with the gate terminals in order to assure that the gate electrode doesn't reach quite the same positive voltage as the anode electrode of the SCR's. One other problem which is resolved by the present invention is that in testing of amplified gate silicon controlled rectifiers, even though the applied gate current is as much as half an amp, the SCR would not remain in the latched condition once the gate circuit had been deenergized. One method which has been found to overcome this problem is to provide an extra surge of current when the SCR is initially switched into conduction. In the present invention this extra current is provided by means of a series capacitor 188 and resistor 190 connected between terminals J21 and J12 such that capacitor 188 may be charged by the battery in the motor control circuit. A zener diode 192 prevents the capacitor from being overcharged. With this arrangement, when the SCR is gated, the capacitor 188 discharges through the SCR thereby forcing it into a latched condition.

In testing the SCR's in the motor control circuit switch 11 is sequentially switched through each of the contacts 90, 91, and 92 while actuating the switches 12, 14 and 16 to apply gate current to each of the SCR's. In a fourth position identified by contact 194 and 170, the battery 86 is connected by means of switch 34 in parallel with lamp 18. When switch 34 is closed, battery 86 is loaded via lamp 18 and the positive terminal on battery 86 is connected to an input terminal of comparator 158 by means of resistor 166 to thereby test the operation of the analyzer. In the embodiment described, battery 86 is selected as a 6 volt battery and the voltage divider comprising resistors 166 and 168 is designed to supply a voltage sufficient to gate comparator 158 into conduction if the battery voltage is at least 4½ volts. This arrangement allows simultaneous testing of lamp 18 of comparator 158 and comparators 118, 132 and 146 and their associated LED's 126, 138, and 154. A fifth contact 196 of switch 11 is provided as an open contact for an OFF position of switch 11 in order to minimize current drain when the analyzer is not in use.

For testing of components such as acceleration potentiometer 68 and switch 82 of the motor control system, the analyzer 10 may be provided with internal jumper cables to extend the connections associated with these components in order to allow continuity tests to be performed with external measuring instruments such as a volt-ohmmeter.

As can be seen, the analyzer of the present invention provides a means for individually testing and actuating various types of electrical components in a motor control circuit in a simplified and economical manner.

While there has been shown and described what is at present a preferred embodiment of the invention, it will be obvious to those skilled in the art that various modifications may be made without departing from the spirit and scope of the invention. It is intended therefore that the invention not be limited by the illustrated embodiment but that the amended claims be given full consideration in defining the breadth of the invention.

What is claimed and desired to be secured by letters patent of the United States is:

1. Test apparatus adapted for connection to an electric vehicle propulsion control system of the type wherein a power control system comprising plural types of electrical components supplies regulated electric power from a traction battery to electric traction motor means, and a logic circuit is normally connected to control the operation of the power control system, said test apparatus being adapted for connection to said propulsion control system in lieu of said logic circuit for testing individual components of said power control system in situs, and comprising:
   a. a plurality of output terminals adapted for simultaneous connection to said propulsion control system;
   b. plural switching means adapted to be selectively actuated, in accordance to the individual one of said components to be tested;
   c. a plurality of indicating means adapted to provide a discrete indication of performance of components being tested;
   d. a plurality of voltage comparators, each comprising first and second inputs and an output coupled to at least one of said indicating means;
   e. a first group of said output terminals being adapted for connection in circuit with said traction battery and with predetermined ones of the components of said propulsion control circuit; and f. connection means connecting said first group of output terminals, in circuit with predetermined ones of said switching means and the inputs of said voltage comparators such that upon actuation of selected ones of said predetermined ones of said switching means a first signal produced by application of the traction battery to a circuit comprising the component under test is applied to a first input of one of said comparators and a second signal representative of the voltage of said traction battery is applied to a second input of said comparator whereby said indicating means provides a discrete indication of component performance irrespective of voltage variations of said traction battery within a predetermined range.

2. The test apparatus of claim 1 comprising a source of D-C potential, said source being connected to energize said voltage comparators and said indicating means.

3. The test apparatus of claim 2 adapted to provide a discrete indication of the performance of controlled static semiconductor devices of said power control system comprising:

a. a second group of said output terminals being adapted for connection to the electrodes of said controlled static devices; and b. means for connecting said second group of output terminals in circuit with said source of D-C potential, selected ones of said switching means, and said indicating means whereby closure of selected ones of said switching means is adapted to produce conduction of a selected one of said controlled static devices and a selected one of said indicating means providing a discrete indication of performance of the selected one of said devices.

4. The apparatus as defined in claim 1 wherein said switching means are interlocked to prevent excitation voltage from being applied to said traction motor during testing of said control system.

5. The apparatus as defined in claim 3 wherein said switching means comprises a first two-wafer five contact rotary switch and second, third and fourth pushbutton switches and a plurality of diodes, first, second and third contacts of said first switch being connected respectively to first, second and third output terminals of said apparatus via a corresponding one of said plurality of diodes, said first, second and third contacts being connected respectively to fourth, fifth and sixth output terminals via corresponding series connected pairs of said plurality of diodes and said second, third and fourth pushbutton switches, a wiper of a first wafer of said first switch being serially connected to a wiper of a second wafer of said first switch through the series combination of said power source and one of said indicating means, said first switch being effective to provide an excitation voltage of higher value at said first, second and third output terminals than the excitation voltage at said fourth, fifth and sixth output terminals to thereby provide a gating and hold voltage for testing of a silicon controlled rectifier.

6. The apparatus as defined in claim 5 and including a storage capacitor adapted to be connected in electrical parallel with said power source and arranged to discharge upon actuation of at least one of said pushbutton switches to provide a surge current to at least one of said silicon controlled rectifiers.

7. A circuit arrangement for testing an electric vehicle control unit, said control unit including a source of direct current power, a power switch for supplying voltage to an electric motor, a commutating capacitor, a commutating switch arranged to connect said capacitor in parallel to said power switch and a plurality of control inputs, said circuit arrangement comprising:

a first manually operated switching means a first indicating means;

a first logic circuit connected to control said first indicating means said first switching means being connected in circuit with said source of direct current power and said commutating capacitor such that said commutating capacitor is discharged upon closure of said frist switching means and is recharged upon opening of said first switching means; said first logic circuit being connected to excite said first indicating means when said first switching means is closed and maintain said indicating means excited after said first switching means is opened and until said capacitor charges to a predetermined level.

8. A circuit arrangement as described in claim 7 and including an independent source of electrical power and a second indicating means arranged in series therewith, circuit means for connecting said independent power source and said second indicating means in parallel with said power switch and means for selectively closing said power switch to excite said second indicating means to verify proper closing of said power switch.

9. A circuit arrangement as described in claim 8 and including means for connecting said first indicating means in electrical parallel with said independent source, second logic means for determining the voltage across said indicating means; and third indicating means connected to said logic meas for verifying that the voltage of said independent source is in excess of a prescribed level.

10. A circuit arrangement as defined in claim 9 and including additional logic circuits and corresponding additional indicating means connectable by said switching means to said control unit, said logic circuits being connected to receive a signal from said first logic means when said independent source voltage exceeds a prescribed level, said signal being effected to energize said additional logic circuits to cause said additional indicating means to be excited to thereby verify proper operation of said circuit arrangement.

11. Test apparatus adapted for connection to an electric vehicle propulsion control system of the type wherein a power control system supplies regulated electric power from a traction battery to electric traction motor means, said power control system comprising a plurality of controlled static rectifiers for power switching and commutating each comprising anode, cathode, and gate electrodes, said test apparatus being adapted for connection to said propulsion control system in lieu of said logic circuit for testing individual components of said power control system in situs, and comprising:

a. plurality of output terminals adapted for connection to the electrodes of the controlled static devices in said propulsion control system;

b. plural switching means adapted to be selectively actuated in accordance to the individual one of said components to be tested;

c. indicating means adapted to provide a discrete indication of performance of components being tested;
d. a source of D-C potential;
e. diode means;
f. additional switching means;
g. means for connecting said output terminals in circuit with said source of D-C potential, said switching means and said indicating means to provide a series circuit comprising said D-C source, said indicating means, and the anode and cathode of a selected one of said controlled static rectifiers; and
h. means for connecting said output terminals in circuit with said source of D-C potential, said diode means, and said additional switching means whereby actuation of said additional switching means applies to the gate electrode of said selected one of the controlled static rectifiers a gating voltage having a potential intermediate the anode and cathode potentials to provide turn on of the selected one of the controlled static rectifiers.

* * * * *

UNITED STATES PATENT OFFICE
CERTIFICATE OF CORRECTION

PATENT NO. : 4,002,972

DATED : January 11, 1977

INVENTOR(S) : Charles E. Konrad et al.

It is certified that error appears in the above—identified patent and that said Letters Patent are hereby corrected as shown below:

Column 8, line 15 "frist" should be -- first --

Column 8, line 19 after "and" insert the word -- to --

Column 8, line 37 "meas" should be -- means --

Signed and Sealed this

Twenty-sixth Day of April 1977

[SEAL]

Attest:

RUTH C. MASON
*Attesting Officer*

C. MARSHALL DANN
*Commissioner of Patents and Trademarks*